United States Patent [19]

Dickinson et al.

[11] Patent Number: 5,332,651
[45] Date of Patent: Jul. 26, 1994

[54] PHOTOCURABLE COMPOSITIONS COMPRISING GRAFTED POLYVINYL ALCOHOL DERIVATES

[75] Inventors: Peter Dickinson, Broadstairs; Julie E. Pratt, Broadstairs; Fereidoun Abbasi, Margate, all of England

[73] Assignee: Sericol Limited, United Kingdom

[21] Appl. No.: 12,918

[22] Filed: Feb. 3, 1993

[30] Foreign Application Priority Data

Feb. 3, 1992 [GB] United Kingdom ............ 9202246.6

[51] Int. Cl.⁵ .................. G03C 7/28; C08F 2/46; C08G 8/38
[52] U.S. Cl. .................... 430/270; 430/281; 430/287; 522/74; 522/88; 522/110; 522/135; 522/154
[58] Field of Search ............ 430/270, 281, 286, 287; 522/74, 88, 110, 135, 154

[56] References Cited

U.S. PATENT DOCUMENTS

| 2,610,120 | 9/1952 | Minsk et al. ................. 95/7 |
| 4,444,868 | 4/1984 | Ichimura ..................... 430/285 |
| 4,621,044 | 11/1986 | Fujikawa ..................... 430/281 |
| 4,920,030 | 4/1990 | Ichimura et al. ............... 430/270 |
| 5,061,603 | 10/1991 | Hamilton et al. ............... 430/287 |

FOREIGN PATENT DOCUMENTS

| 0092901 | 11/1983 | European Pat. Off. ....... G03F 7/10 |
| 0130804 | 1/1985 | European Pat. Off. ....... G03C 1/68 |
| 0252150 | 1/1988 | European Pat. Off. ....... G03C 1/00 |
| 0261981 | 3/1988 | European Pat. Off. ....... G03F 7/10 |
| 0313221 | 4/1989 | European Pat. Off. ....... G03F 7/12 |
| 0373537 | 6/1990 | European Pat. Off. ..... G03F 7/038 |
| 0373862 | 6/1990 | European Pat. Off. ..... G03F 7/038 |
| 58-71905 | 4/1983 | Japan ........................ C08F 8/28 |
| 2030575 | 4/1980 | United Kingdom ........... C08F 8/28 |
| 2076826 | 12/1981 | United Kingdom ........... C08F 8/30 |
| 2108979 | 5/1983 | United Kingdom ........... C08F 2/80 |
| 2109392 | 6/1983 | United Kingdom ........... C08F 2/50 |
| 2174997 | 11/1986 | United Kingdom ........... C08F 8/30 |

*Primary Examiner*—Susan Berman
*Attorney, Agent, or Firm*—Bacon & Thomas

[57] ABSTRACT

Photopolymerizable grafted polyvinyl alcohols including groups of formula

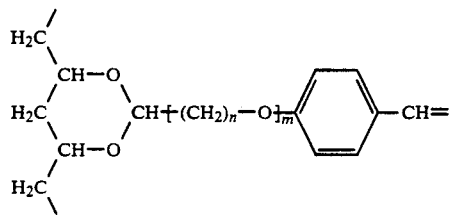

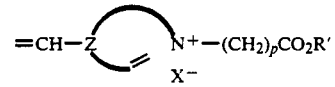

wherein n represents zero or an integer from 1 to 6, m represents zero or 1 (with the proviso that m represents zero when n represents zero), Z together with the nitrogen and carbon atoms to which they are attached represent a heterocyclic ring optionally fused to one or more benzenoid or heterocyclic rings, X⁻ represents an anion, R' represents an alkyl group, and p represents an integer from 1 to 4. Compositions containing such grafted polyvinyl alcohols, for example for screen printing stencils, have shown high sensitivity to light.

8 Claims, No Drawings

PHOTOCURABLE COMPOSITIONS COMPRISING GRAFTED POLYVINYL ALCOHOL DERIVATES

This invention concerns photocurable compositions for the production of screens for screen printing.

In screen printing a negative of a print design, known as a stencil, is produced on a mesh of a polymer (usually a polyester) or of stainless steel stretched over a wooden or metal frame, the areas of mesh where printing is not to be effected (stencil areas) being covered with a material impervious to the ink to be used for the printing.

Many methods have been proposed for the production of screen printing stencils. Stencils can be prepared either independently of the screen, by the indirect film method, or on the screen itself by the direct method.

In the indirect method, a photosensitive layer is coated on to a temporary support sheet, usually a transparent polyester sheet, and following exposure to actinic light the layer is developed on the support sheet using water to remove unexposed areas of the photosensitive layer. The wet stencil on its support is then adhered to the screen mesh by the application of gentle, even pressure, and, after drying, the support sheet is removed, leaving the stencil on the screen mesh ready for printing.

In the direct method, a photosensitive emulsion is coated on to a mesh and dried to give a continuous, even film. A stencil is then produced by imaging the coating photographically through a line or half tone positive and then developing an image with a spray of water, again to remove unexposed areas of the film.

A further technique, the so-called capillary film method, involves the application of a photosensitive layer to a polyester sheet which is then transferred to a mesh prior to imaging. Imaging and development are then effected as described for the direct method.

Combinations of emulsions and films are also possible in which a direct emulsion is used to adhere a film to a mesh. Development of the stencil is then as with the direct method.

The photosensitive coatings for all of these techniques are polymer-based, and their formulation is important to achieve chemical and thermal resistance in use and during manufacture, dimensional stability, flexibility, maintenance of light stability and permeability to liquids.

Compositions used to prepare screen printing stencils are in general based on water soluble colloids acting as binder resins, usually polyvinyl alcohol in the case of direct emulsions and capillary films. The compositions are such that those areas of the coatings irradiated by actinic light remain on the screen after development, as they become insoluble in water, while those areas protected from actinic light retain their water solubility and are easily washed away on development.

Image development necessitates rendering insoluble to water a coating of a water soluble colloid, either by crosslinking the colloid or by forming a secondary polymer matrix within the coating structure, thereby preventing redispersion of the colloid during subsequent aqueous development.

Crosslinking of colloids can be achieved by a number of methods using ultra violet radiation. Colloidal polymer molecules having reactive groups along the polymer chain can crosslink with other polymer molecules via such groups. Alternatively, some reactive groups require an intermediate crosslinking agent. The accompanying increase in molecular weight of the colloid, due to photopolymerization, changes the physical character of the polymer so as radically to reduce its solubility in water.

Secondary polymer matrices are formed by dispersing photopolymerizable monomers and/or oligomers in the aqueous colloidal solution, coating it to form a film, and exposing it to ultra violet radiation.

Oligomers are preferred because the rate of insolubilization of the compositions on exposure is usually more rapid, presumably due to a rapid establishment of a network polymer structure and also because of their lower rate of evaporation on drying. Their outstanding performance as low molecular weight addition polymerizable components is due to a plurality of addition polymerizable linkages, terminal linkages being particularly reactive. A photoinitiation may be required to initiate the addition polymerization reaction.

Important requirements for colloidal binder resins for producing screen printing stencils are solvent resistance, decoatability and water solubility. Polyvinyl alcohol derivatives meet all of these requirements as well as having good mechanical strength and heat resistance. The decoating of polyvinyl alcohol derivatives can simply be achieved by selectively oxidising 1,2-diol groups on the polymer chain using a periodate. Small amounts (up to 2 percent) of hydroxy groups on polyvinyl alcohol chains are present as 1,2-diol groups. It has been suggested that their occurrence depends on the temperature at which the polymerization of the vinyl acetate used to form the polyvinyl alcohol is effected, polyvinyl alcohol being obtained from polyvinyl acetate by saponification.

The water solubility of polyvinyl alcohol derivatives is related both to their molecular weight and to their degree of hydrolysis. In general, they are rendered water soluble when at least 70 percent of the acetate groups of the precursor polyvinyl acetate are hydrolysed to hydroxy groups. Larger numbers of acetate groups result in the polymer having hydrophobic portions which repel the infusion of water. Conversely, totally hydrolysed polyvinyl alcohols are only slightly soluble in cold water as a result of strong intermolecular hydrogen bonding which imparts a high level of crystallinity to the solid resins. Lower molecular weight grades of polyvinyl alcohol tend to have a greater solubility in water than do higher molecular weight grades.

Photocrosslinkable compositions using polyvinyl alcohol suitable for producing screen printing stencils are well known in the art. Original systems were photosensitized immediately prior to use by adding a dichromate compound or a polymeric diazonium salt. These compositions have the disadvantage of being supplied as two packs, one consisting of a sensitizer and the other a base colloid. After mixing, the compositions usually have a useful pot-life of a matter of days when the sensitizer is a dichromate, and a maximum of three months when the sensitizer is a polymeric diazonium salt. When sensitized emulsion is stored for longer periods under conditions of normal temperature and humidity, a so-called dark reaction occurs which makes even unexposed areas of the film insoluble in water. Furthermore, compositions containing chromium compounds are undesirable because they are irritants and present environmental problems due to their toxicity.

Another disadvantage of dichromate and diazonium salt sensitized compositions is the limited life of unexposed screens produced from them. The sensitivity of the compositions also varies with temperature, age and relative humidity. Many attempts have been made to overcome these various disadvantages, for example by the replacement of dichromate or diazonium salt photosentizers by more stable sensitizers.

Improved photosensitive compositions can be produced by reacting the polyvinyl alcohol with a compound having a photocrosslinkable group or by dispersing a photocrosslinkable unsaturated or epoxy monomer or oligomer in the polyvinyl alcohol. A combination of both approaches has also been suggested.

U.S. Pat. No. 2,610,120 describes light sensitive photocrosslinkable polyvinyl alcohol derivatives obtained by esterifying the hydroxy groups of the polyvinyl alcohol with a cinnamoyl halide. However, the high levels of cinnamoyl groups needed for crosslinking decrease the number of hydroxy groups to such an extent that the compositions derived from them show a remarkable decrease in water developability and are therefore unsuitable for aqueous systems. These systems also have the disadvantage of requiring spectral sensitization to increase their sensitivity to the actinic light emitted from metal halide lamps normally used in screen printing stencil production even though they will crosslink under the influence of ultraviolet light.

British Patent Specification 2030575 describes photopolymerizable compositions containing polyvinyl alcohol having grafted N-methylstyrylpyridinium groups. These groups overcome disadvantages of grafted cinnamate groups since they maintain the solubility of the polyvinyl alcohol when grafted at low levels. N-Methylstyrylpyridinium groups are self-sensitising, but the level of N-methylstyrylpyridinium groups which can be grafted while maintaining water solubility is very limited. However, a high degree of photosensitivity can be achieved at extremely low concentrations of such groups. The photopolymer therefore retains many of the properties of the original polyvinyl alcohol. One consequence of this is that crosslinked stencils can easily be decoated with a periodate. Compositions of this type have exhibited poor adhesion to the mesh, and the choice of anion is limited to those of strong acids.

European Patent Specification 92901 describes polyvinyl alcohol having pendant chalcone groups as photocrosslinkable groups. These photopolymers can be prepared in high yield from readily available and inexpensive starting materials, and their structures can easily be varied in order to select a U.V. absorption wavelength at or about a desired value to match the spectral emission characteristics of the light source used for exposure. However, these systems have the disadvantage that the rate of photocrosslinking is slow, requiring long exposure times when printing screens are being made.

European Patent Specification 130804 describes compositions including polyvinyl alcohol having grafted N-methylstyrylpyridinium groups, a free-radical photopolymerizable, ethylenically-unsaturated compound, and a free-radical photopolymerization initiator. Water-dispersible polymers or hydrophobic polymers can also be added. These compositions produce stencils which have good solvent resistance, water resistance and abrasion resistance. The use of polyvinyl alcohol with grafted N-methylstyrylpyridinium groups serves to facilitate dispersion of the photopolymerizable unsaturated compound. Again, the choice of anions is limited to those of strong acids. The anionic water soluble thioxanthenone derivatives described in British Patent Specification 2108979 cannot be used in such compositions as free radical photopolymerization initiators since gel formation occurs.

European Patent Specification 252150 highlights another disadvantage of compositions of the type described in British Patent Specification 2030575 and European Patent Specification 92901. In particular, cured compositions containing grafted polyvinyl alcohol of the types described in these Specifications have insufficient adhesion to form stencils and this can cause peeling of the cured stencil during development by spraying with water. Another disadvantage of these compositions is the absence of a color change to give a visible image after exposure of coatings of the compositions. Diazonium salts can be used to overcome these problems but this is unsuitable for the production of high quality stencils. Short pot lives can also result from the use of certain diazo compounds.

British Patent Specification 2174997 describes aqueous emulsions of a film-forming vinyl polymer resin and a protective colloid for the emulsion. The protective colloid consists of at least one photosensitive saponified polyvinyl acetate with at least one N-methylstyryl pyridinium group and at least one hydrophilic unit bonded to the polymer backbone. The photosensitive saponified polyvinyl acetate derivative is at least partially grafted on to the said film-forming vinyl polymer resin. Compositions of this type exhibit excellent water resistance and solvent resistance by water development.

U.S. Pat. No. 4,444,868 describes a photosensitive composition consisting of a photo-insolubilizable resin having a styryl type nitrogen-containing heterocyclic residue, photosensitivity being increased in the presence of an organic or inorganic acid. High molecular weight photosensitive copolymers of such resins with acrylic or methacrylic acid are said to have a high sensitivity to actinic radiation for an extremely small amount of photosensitive reactive groups in such materials.

European Patent Specification 261981 describes photosensitive resins consisting of a photosensitive saponified polyvinyl acetate derivative with a backbone containing at least one quaternized styryl pyridinium group and at least one N-methylolmethylacrylamide group. Such compositions have shown high sensitivity, good water development, excellent water, solvent, acid and alkali resistance and good resolving power.

Japanese Patent publications 56/170364 (1981) and 58/71905 (1983) describe an acid catalysed method of reacting photosensitive aldehydes with polyvinyl alcohol which is suspended rather than dissolved in water or water-solvent mixtures. The acid catalyst and unreacted aldehyde are easily removed by filtration and washing of the polyvinyl alcohol particles. The aldehydes contain a styryl group linked to a nitrogen-containing heteroaromatic ring in which the nitrogen atom is quaternized.

European Patent Specification 313221 describes the preparation and use for screen printing photostencils of photodimerizable polymer compositions containing photosensitive styryl type heterocyclic residues. These compositions exhibit high photosensitivity, thereby enabling thick layers to be through-cured when given relatively short exposure times.

It is significant that in all of the above prior art, the aldehydes which are reacted with the polyvinyl alcohol are of the general formula

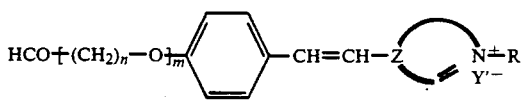

where R represents a hydrogen atom, an alkyl or aralkyl group optionally substituted by a hydroxy or carbamoyl group or including an ether linkage or an unsaturated bond, n represents zero or an integer from 1 to 6, m represents zero or 1 (with the proviso that n represents zero when m represents zero), Z together with the nitrogen and carbon atoms to which they are attached represent a heterocyclic ring optionally fused to one or more benzenoid or heterocyclic rings, and Y'− represents an anion. U.S. Pat. No. 5,061,603 describes polyvinyl alcohol modified with styryl pyridinium groups in which R in the above formula represents a substituted or unsubstituted alkoxy or hydroxy group.

European Patent Specification 373537 describes amphoteric photosensitive polyvinyl alcohol derivatives in which R in the above formula represents a group of formula —$R_1$—Y", wherein $R_1$ represents an alkylene group and Y" represents $SO_3^-$ or $CO_2^-$. It is said that these derivatives do not color when they are heated. The low aqueous solubility of these amphoteric aldehyde precursors compared with that of those in which R represents a methyl group is a significant drawback, particularly for the carboxylates. Efficient acetalization with polyvinyl alcohol therefore requires the addition of a solvent in order to solubilize the amphoteric derivatives. However, the use of solvent-water mixtures is less desirable than effecting the reaction in a totally aqueous solvent. The amphoteric polyvinyl alcohol derivatives described in European Patent Specification 373537 in general require exposure times similar to those of polyvinyl alcohol derivatives obtained from the compounds of formula I (as hereinbefore defined).

According to the present invention there are provided photopolymerizable compounds of formula

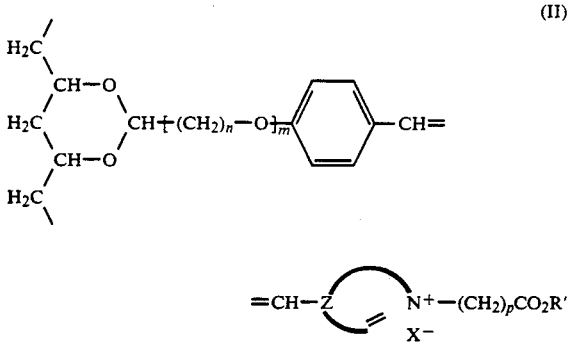

wherein n represents zero or an integer from 1 to 6, m represents zero or 1 (with the proviso that m represents zero when n represents zero), Z together with the nitrogen and carbon atoms to which they are attached represent a heterocyclic ring optionally fused to one or more benzenoid or heterocyclic rings, X− represents an anion, R' represents an alkyl group, and p represents an integer from 1 to 4.

X− can be selected from a wide range of anions, halide ions, for example chloride, bromide or iodide ions, often resulting from the process by which the corresponding aldehyde or acetal thereof is prepared. As will be appreciated by those skilled in the art, a particular anion X− can be exchanged for another anion X−, for example using known methods.

Polyvinyl alcohol derivatives of the formula II can be prepared by reacting the corresponding aldehyde of formula

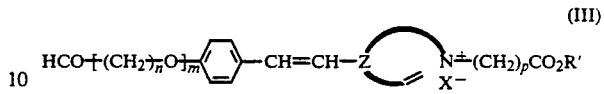

(wherein R', m, n, p, X− and Z are as hereinbefore defined), or an acetal thereof with a low molecular weight aliphatic alcohol, with polyvinyl alcohol. The reaction is preferably effected under acidic conditions, for example analogously to the method described in British Patent Specification 2030575.

Aldehydes of the formula III (as herein before defined) can be prepared by known methods, for example by reacting an aldehyde of formula

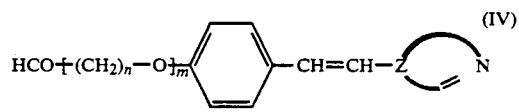

(wherein n, m and Z are as hereinbefore defined) with a compound of formula $$Y—(CH_2)_p—CO_2R'$$ (V)

(wherein R' and p are as hereinbefore defined and Y represents a displaceable moiety, preferably as an anion, for example a halogen atom).

The aldehydes of formula IV can be prepared by known methods, for example by reacting a compound of formula

(wherein Z is as hereinbefore defined) with a compound of formula

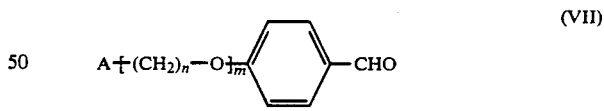

(wherein A represents an aldehyde or acetal group, and m and n are as hereinbefore defined), for example using known methods.

The present invention also provides compositions for producing screen printing stencils, the compositions comprising a grafted polyvinyl alcohol in accordance with the invention. However, grafted polyvinyl alcohol in accordance with the invention can be used in other applications which require photosensitive materials.

Compositions of this invention have exhibited higher sensitivity to light than prior art compositions in which R in formula I represents a methyl group whilst being much more water soluble than the amphoteric derivatives described in European Patent Specification 373537. This enables acetal formation with polyvinyl alcohol to be carried out using water as the solvent, without the necessity for the addition of other solvents.

The average degree of polymerization of the polyvinyl alcohol is preferably from 350 to 2500. The degree of hydrolysis of the polyvinyl alcohol is preferably from 72 to 99 percent, i.e. derived from polyvinyl acetate. A mixture of polyvinyl alcohol derivatives can be used having different degrees of polymerization and/or hydrolysis. The polyvinyl alcohol can, for example, be of a type proposed hitherto for use in screen printing. Other water-soluble polymers containing units derived from vinyl alcohol can be used, e.g. copolymers with unsaturated carboxylic acids and their salts.

Compositions of the present invention will usually be supplied in liquid form or as a coated film. Although the compositions of the present can be supplied in a diluted form for ease of application, the amount of the grafted polyvinyl alcohol will usually be present in an amount such that it represents up to about 40 percent of the dried film weight.

Other materials which can be included in compositions of the present invention include fillers and/or extenders, for example for increasing the solids content of the compositions and additives which improve the performance of the compositions. Fillers and/or extenders can be used to increase the thickness or build of layers of compositions of this invention when they are used to form screen printing stencils. Various fillers and/or extenders can be used, and they can be inert, film-formable and/or photopolymerizable in their own right. Suitable fillers for increasing the solids content of the compositions include polyvinyl acetate, copolymers of vinyl acetate with one or more further vinyl monomer or acrylic monomer, starch, polyethylene, fluorine-containing polyalkenes, (e.g. polytetrafluoroethylene), kaolin, titanium dioxide, silica and talc.

Hydrophobic polymers can be added to compositions of the present invention in the form of an aqueous dispersion solubilized by a surfactant or a water soluble colloid. Polyvinyl alcohol is particularly preferred as the water soluble colloid. Polymer dispersions can be produced with high solids contents, e.g. up to 70 percent by weight, without imparting an excessively high viscosity to compositions of the invention. This can enable improved compositions to be prepared.

Other photopolymerizable materials can be added to compositions of the present invention. These materials can be used to produce a secondary matrix within a layer of the compositions, this secondary matrix generally serving to enhance the properties of the layer. Materials having this property have been proposed hitherto, but they should be selected and formulated carefully so that the decoating properties achieved using polyvinyl alcohol as the film former are not lost. Hydrophobic or hydrophilic photopolymerizable unsaturated compounds can be dissolved or dispersed in the compositions of the present invention. Hydrophobic and sparingly soluble compounds will usually be dissolved in a solvent compatible with the grafted polyvinyl alcohol as described in British Patent Specification 2109392. Compounds having at least two photocrosslinkable groups are especially preferred because cross-linked products with good solvent resistance have been obtained. These can include a prepolymer containing terminal ethylenic unsaturation joined to the residue of a polyester, epoxy or urethane prepolymer via ester, amide or urethane linkages. Other unsaturated dispersible materials can also be used, for example pentaerythritol triacrylate, pentaerythritol trimethacrylate, pentaerythritol tetracrylate, trimethylol propane triacrylate, tripropyleneglycol diacrylate and triethyleneglycol diacrylate.

Hydrophilic unsaturated compounds which can be used include those having an affinity for polyvinyl alcohol, and they can also serve to provide a continuous polyvinyl alcohol phase in the compositions of the invention. Examples of such materials include N-vinylpyrrolidone, polyethylene glycol 200 diacrylate, and Lankro RCP 2685, 2701, 2785 and 2850 (water thinnable UV curable acrylate resins).

Polyfunctional acrylate and methacrylate oligomers described in U.S. Pat. No. 4,621,044 can also be used in compositions of the present invention, the grafted polyvinyl alcohol in general being compatible with such oligomers over a much wider range of concentrations than the polymers described in U.S. Pat. No. 4,621,044. Furthermore, these oligomers have imparted improved flexibility to cured compositions of the present invention.

Where compositions according to the present invention contain other photopolymerizable materials, a photoinitiator is usually required.

The photoinitiator can be selected from photoinitiators proposed for the free radical polymerization of unsaturated compounds by exposure to actinic light. However, since the compositions of the present invention will usually be exposed to actinic light through glass, it is preferred that the photoinitiator absorbs at a wavelength above 325 nm. Preferred photoinitiators include thioxanthenone derivatives, substituted benzophenones and benzils, and acyl phosphine oxides. Particularly preferred photoinitiators are thioxanthenones, e.g. 2-hydroxy-3-(3,4-dimethyl-9-oxo-9H-thioxanthenone-2-yl-oxy)-N,N,N-trimethyl-1-propanaminium chloride, 2-hydroxy-3-(1-methyl-9-oxo-9H- thioxanthenone-4-yloxy)-N,N,N-trimethyl-1-propanaminium chloride and anionic derivatives of the type described in British Patent Specification 2108979-A, e.g. the sodium salt of 2-(3-sulfopropoxy)-thioxanthenone. Other photoinitiators which can be used include benzophenone derivatives, e.g. 4-benzoyl-benzyl trimethylammonium chloride, or benzil derivatives, e.g. sodium 4-(sulfomethyl)-benzil.

The photosensitivity of such compositions of the present invention can be further increased by the inclusion of an accelerator, preferably a tertiary amine when a thioxanthenone or benzophenone photoinitiator is used. Preferred tertiary amines contain at least one group derived from an aliphatic alcohol, for example N-methyl-diethanolamine or N,N-dimethylethanolamine. The preferred amount of accelerator is from 0.1 to 8 percent, more preferably from 1 to 5 percent, by weight of the dry film. In addition, it is usually preferred to include an inhibitor of thermal polymerization.

Compositions of the invention can also contain emulsion stabilizers, wetting agents, defoaming agents or plasticizers to improve their overall performance. It is preferred to include a fungicide to inhibit fungal growth. Furthermore, dyes or pigments can be included to provide visible screens from the compositions.

The following Examples are given by way of illustration only. All parts are by weight unless stated otherwise.

EXAMPLE 1

A mixture of 400 parts of terephthaldehyde, 120 parts of acetic acid and 300 parts of acetic anhydride was refluxed for two hours. 188 parts of 4-picoline were then added over a period of 45 minutes, and the dark brown mixture was refluxed for a further 2 hours. 3300 parts of 1M aqueous hydrochloric acid were then added. The desired product was extracted with toluene and treated with 5M sodium hydroxide to a pH between 5 and 6. The crude solid product was dissolved in hot ethyl acetate and the solution was filtered. Cooling of the filtrate gave the desired product, 4-(2-(4-formylphenyl)-ethenyl)-pyridine.

To a mixture of 20 parts of 4-(2-(4-formylphenyl)-ethenyl)-pyridine and 80 parts of toluene were added 21 parts of methyl bromoacetate in 20 parts of toluene. The mixture was heated to 100° C. for 2 hours, after which it was cooled to room temperature and diluted with acetone. The precipitated 1-(methoxycarbonylethyl)-4-(2-(4-formylphenyl)-ethenyl)-pyridinium bromide was filtered off and air dried.

To a mixture of 2 parts of 1-(methoxycarbonylmethyl)-4-(2-(4-formylphenyl)-ethenyl)-pyridinium bromide dissolved in 50 parts of water were added 167 parts of aqueous polyvinyl alcohol (13 percent by weight solution of Gohsenol GH17 (ex Nippon Gohsei) in water). 1 Part of phosphoric acid (85 percent) was added as a catalyst. The mixture was heated to 60° C. for 5 hours and then left at room temperature for 20 hours. The resulting mixture was diluted with 33.4 parts of water and then treated with 10 parts of Amberlyst 21 ion exchange resin and the resin filtered off after 1 hour. The resultant aqueous solution of grafted polyvinyl alcohol was used without further purification.

EXAMPLE 2

To a mixture of 20 parts of 4-(2-(4-formylphenyl)-ethenyl)-pyridine prepared as in Example 1 and 80 parts of toluene were added 21 parts of ethyl bromoacetate in 20 parts of toluene. The mixture was heated to 100° C. for 2 hours, after which it was cooled to room temperature and diluted with acetone. The precipitated 1-(ethoxycarbonylmethyl)-4-(2-(4-formylphenyl)ethenyl)-pyridinium bromide was filtered off and air dried.

This pyridinium salt was then grafted on to polyvinyl alcohol as described in Example 1.

COMPARATIVE EXAMPLE 3

4-[2-(4-Formylphenyl)ethenyl]-1-methyl pyridinium methyl sulfate prepared as described in U.S. Pat. No. 4,920,030 and it then was acetalized on to polyvinyl alcohol by the procedure outlined in Example 1, to exemplify prior art compositions.

EXAMPLE 4

Grafted polyvinyl alcohols produced as described in Examples 1 to 3 were each pigmented with Impeton Blue, and each was then coated on to a 120 HDW mesh screen by applying two coats to each side of a 120 HDW polyester screen printing mesh, and they were then exposed to 200 light units using a metal halide lamp fitted with an integrator through a Stouffer 21 step sensitivity guide. Following development with a water spray the step number at which the coating appeared untouched was noted as was the last step number at which some coating remained on the mesh. This latter number is shown in parenthesis.

| Example 1 | Example 2 | Example 3 |
| --- | --- | --- |
| 13 (18) | 14 (19) | 9 (15) |

EXAMPLE 5

Grafted polyvinyl alcohols (grafted PVOH) produced as described in Examples 1 to 3 were each made up into screen printing photosensitive emulsions by mixing with the following ingredients:

| | |
| --- | --- |
| Grafted PVOH (9.4 percent aqueous solution) | 33.2 parts |
| Aqueous polyvinyl acetate (55 percent solids) | 9.6 parts |
| Surface active agent - Surfynol 440 (Air Products Ltd) | 0.54 part |
| Surfactant - Emulgen 913 (5 percent solids - Kao Corporation Ltd) | 0.54 part |
| Imperon Blue - (Hoechst (UK) Ltd) | 0.2 part |

Each emulsion was then coated on to a 120 HDW mesh screen by applying two coats from each side. The coated screens were dried and then exposed to 25 light units through a 21 step Stouffer sensitivity guide. The steps obtained using the polyvinyl alcohols of Examples 1 to 3 in the formulation of Example 5 were as follows:

| Example 1 | Example 2 | Example 3 |
| --- | --- | --- |
| 6 (11) | 8 (13) | 3 (8) |

EXAMPLE 6

Emulsions containing photcrosslinking species were prepared using the following ingredients:

| | |
| --- | --- |
| Grafted PVOH (9.4 percent aqueous solution) | 25 parts |
| Polyvinyl acetate (55 percent solids) | 15.2 parts |
| Diacrylate of bisphenol A glycidyl ether in propylene glycol diacrylate | 2.2 parts |
| Isopropyl thioxanthone | 0.09 part |
| Ethyl 4-(N,N-dimethylamino)benzoate | 0.04 part |
| Surfynol 440 | 0.5 part |
| Imperon Blue | 0.2 part | the grafted polyvinyl alcohols (PVOH) being the products of Examples 1 to 3. The screens were coated as in Example 5 the steps were as follows:

| Example 1 | Example 2 | Example 3 |
| --- | --- | --- |
| 8 (9) | 8 (10) | 4 (7) |

The above Examples show that the grafted polyvinyl alcohols of the present invention had faster exposure speeds than the prior art grafted polyvinyl alcohol of Example 3 by the former having a higher step and thus a higher degree of photocrosslinking.

We claim:

1. Photopolymerizable grafted polyvinyl alcohols including groups of formula

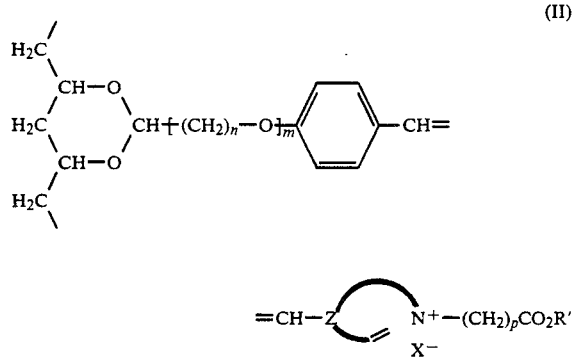

wherein n represents zero or an integer from 1 to 6, m represents zero or 1 (with the proviso that m represents zero when n represents zero), Z together with the nitrogen and carbon atoms to which they are attached represent a heterocyclic ring optionally fused to one or more benzenoid or heterocyclic rings, X⁻ represents an anion, R' represents an alkyl group, and p represents an integer from 1 to 4.

2. Photopolymerizable grafted polyvinyl alcohols according to claim 1, wherein the polyvinyl alcohol has a degree of saponification of from 72 to 99 percent.

3. Photopolymerizable grafted polyvinyl alcohols according to claim 1, wherein groups of formula II are grafted to from 1 to 6 percent of the number of hydroxy groups in the original polyvinyl alcohol available for grafting.

4. Photopolymerizable grafted polyvinyl alcohols according to claim 1, wherein up to 6 percent of the number of hydroxy groups in the original polyvinyl alcohol available for grafting have non-light sensitive acetal or formal groups grafted thereto.

5. A photopolymerizable composition according to claim 1, including at least one dispersed particulate filler.

6. A photopolymerizable composition according to claim 5, wherein the filler comprises polyvinyl acetate or a copolymer of vinyl acetate with at least one further vinyl monomer or with an acrylic monomer.

7. A photopolymerizable composition according to claim 5, wherein the filler comprises starch, polyethylene or a fluorine-containing polyalkylene.

8. A photopolymerizable composition according to claim 1, including at least one photopolymerizable ethylenically unsaturated compound and a photopolymerization initiator.

* * * * *